US011323083B2

(12) United States Patent
Tokunaga

(10) Patent No.: US 11,323,083 B2
(45) Date of Patent: May 3, 2022

(54) AMPLIFIER CIRCUIT

(71) Applicant: Panasonic Intellectual Property Management Co., Ltd., Osaka (JP)

(72) Inventor: Yusuke Tokunaga, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/029,125

(22) Filed: Sep. 23, 2020

(65) Prior Publication Data

US 2021/0006218 A1    Jan. 7, 2021

Related U.S. Application Data

(63) Continuation of application No. PCT/JP2019/014628, filed on Apr. 2, 2019.

(30) Foreign Application Priority Data

Apr. 27, 2018 (JP) .............................. JP2018-086557

(51) Int. Cl.
*H03F 3/45* (2006.01)
*H03F 3/30* (2006.01)
*H03F 3/393* (2006.01)

(52) U.S. Cl.
CPC ............. *H03F 3/393* (2013.01); *H03F 3/303* (2013.01); *H03F 3/45183* (2013.01)

(58) Field of Classification Search
CPC ...... H03F 3/393; H03F 3/303; H03F 3/45183; H03F 2203/45008; H03F 2203/45424; H03F 3/45659; H04N 5/378

(Continued)

(56) References Cited

U.S. PATENT DOCUMENTS

| 4,138,649 A | 2/1979 | Schaffer |
| 5,532,471 A | 7/1996 | Khorramabadi et al. |

(Continued)

FOREIGN PATENT DOCUMENTS

| JP | 8-234853 | 9/1996 |
| JP | 8-274546 | 10/1996 |

(Continued)

OTHER PUBLICATIONS

International Search Report of PCT application No. PCT/JP2019/014628 dated Jun. 25, 2019.

*Primary Examiner* — Hieu P Nguyen
(74) *Attorney, Agent, or Firm* — McDermott Will & Emery LLP

(57) ABSTRACT

An amplifier circuit has: a first amplifier circuit, including a chopper circuit amplifying a first differential signal input between first and second input terminals to output a second differential signal; and a second amplifier circuit amplifying the second differential signal to output a single-ended signal. The second amplifier circuit includes: a first circuit including first and second transistors, the first circuit being connected to the first amplifier circuit so that the second differential signal input into gates of these transistors, the first circuit converting the second differential signal to a current flowing into a first node connected to the first transistor and a current flowing into a second node connected to the second transistor; and a second circuit negatively feeding back a voltage at the second node so that the difference in voltage between these nodes is reduced. The second amplifier circuit outputs the single-ended signal from the first node.

10 Claims, 15 Drawing Sheets

(58) Field of Classification Search
USPC .............................................. 330/252–261, 9
See application file for complete search history.

(56) References Cited

U.S. PATENT DOCUMENTS

| | | | |
|---|---|---|---|
| 5,646,518 | A | 7/1997 | Lakshmikumar et al. |
| 6,028,480 | A | 2/2000 | Seevinck et al. |
| 9,924,904 | B2 * | 3/2018 | Cong .................. A61B 5/6847 |
| 2009/0174479 | A1 | 7/2009 | Yan et al. |
| 2012/0068769 | A1 | 3/2012 | Wang et al. |
| 2014/0340145 | A1 | 11/2014 | Funato et al. |
| 2017/0111018 | A1 | 4/2017 | Horiuchi et al. |

FOREIGN PATENT DOCUMENTS

| | | |
|---|---|---|
| JP | 11-510672 | 9/1999 |
| JP | 2012-065168 | 3/2012 |
| JP | 2014-225742 | 12/2014 |
| JP | 2017-076942 | 4/2017 |
| WO | 2012/053133 | 4/2012 |

\* cited by examiner

AMPLIFIER CIRCUIT

BACKGROUND

1. Technical Field

The present disclosure relates to an amplifier circuit.

2. Description of the Related Art

An amplifier circuit known in related art amplifies an input voltage and outputs the amplified voltage (see U.S. Pat. No. 4,138,649 and International Publication No. WO2012/053133, for example).

SUMMARY

There is a demand for an amplifier circuit that can implement a buffer circuit with reduced noise.

In one general aspect, the techniques disclosed here feature an amplifier circuit that includes: a first amplifier circuit including a chopper circuit, the first amplifier circuit being configured to amplify a first differential signal input between a first input terminal and a second input terminal to output a second differential signal; and a second amplifier circuit configured to amplify the second differential signal to output a single-ended signal. The second amplifier circuit includes a first circuit including a first transistor and a second transistor, the first circuit being connected to the first amplifier circuit so that the second differential signal is input into a gate of the first transistor and a gate of the second transistor, the first circuit being configured to convert the second differential signal to a current that flows into a first node connected to the first transistor and to a current that flows into a second node connected to the second transistor, and a second circuit configured to negatively feed back a voltage at the second node so that a difference between a voltage at the first node and the voltage at the second node is reduced. The second amplifier circuit is configured to output the single-ended signal from the first node.

According to the one general aspect, an amplifier circuit that can implement a buffer circuit with reduced noise can be provided.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Having Led to One Aspect of the Present Disclosure

A noise modulation technology in which chopper modulation is used is known as a technology that achieves low noise (see U.S. Pat. No. 4,138,649, for example), However, a conventional amplifier circuit that uses a chopper modulation technology is problematic in that it is difficult to achieve a high input impedance.

Figure 1:
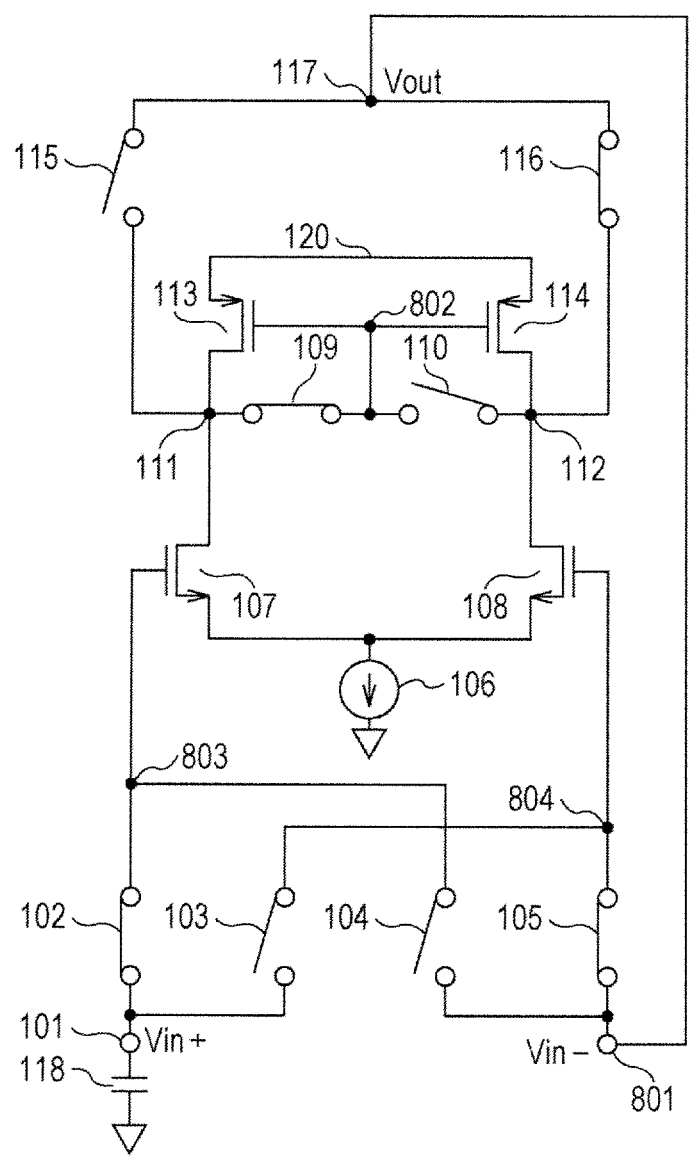
FIG. 1 illustrates the structure of a conventional amplifier circuit.
Figure 2:
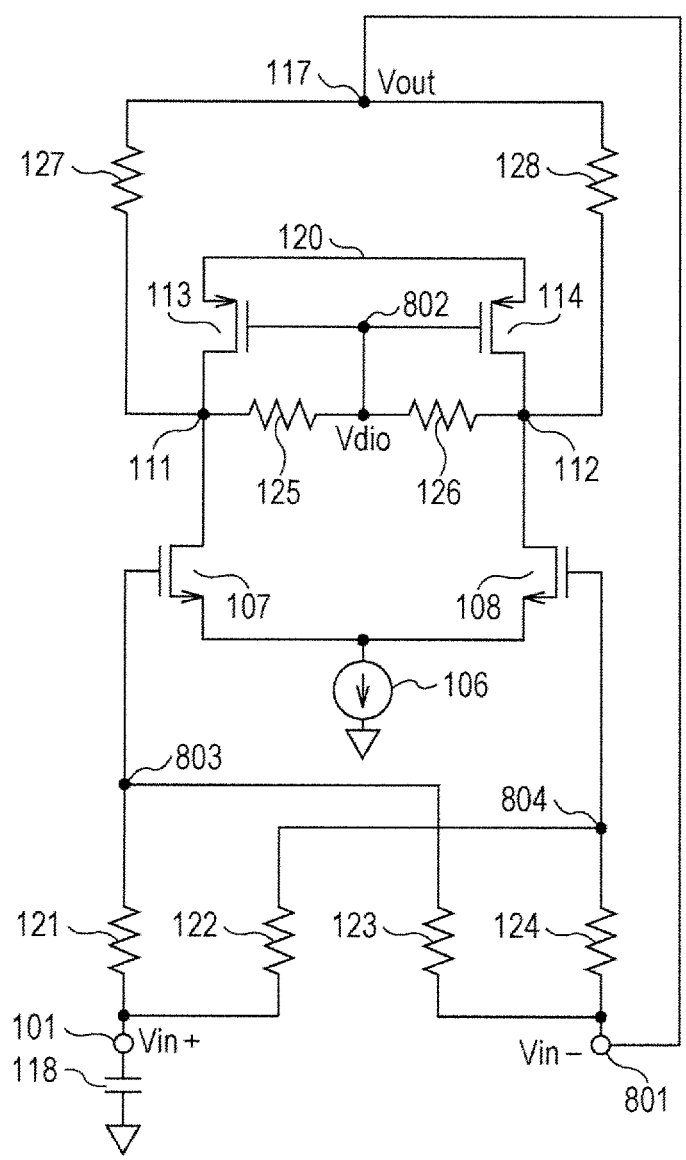
FIG. 2 illustrates the structure of an equivalent circuit equivalent to the conventional amplifier circuit.

FIG. 1 illustrates the structure of a conventional amplifier circuit 100A that uses a chopper modulation technology. FIG. 2 illustrates the structure of an equivalent circuit 100E equivalent to the conventional amplifier circuit 100A.

As illustrated in FIG. 1, the conventional amplifier circuit 100A has input terminals 101 and 801, a terminal 117, a power source 120, nodes 111, 112, 802, 803 and 804, transistors 107 and 108, each of which has a first polarity (an N-channel polarity, for example), transistors 113 and 114, each of which has a second polarity (a P-channel polarity, for example), a current source 106, a capacitor 118, and switches 102 to 105, 109, 110, 115 and 116.

The source of the transistor 107 and the source of the transistor 108 are connected to the current source 106. The source of the transistor 113 and the source of the transistor 114 are connected to the power source 120. The drain of the transistor 107 and the drain of the transistor 113 are connected to the node 111. The drain of the transistor 108 and the drain of the transistor 114 are connected to the node 112. The gate of the transistor 107 is connected to the node 803. The gate of the transistor 108 is connected to the node 804. The gate of the transistor 113 and the gate of the transistor 114 are connected to the node 802. The switch 102 is disposed between the input terminal 101 and the node 803. The switch 103 is disposed between the input terminal 101 and the node 804. The switch 104 is disposed between the input terminal 801 and the node 803. The switch 105 is disposed between the input terminal 801 and the node 804. The switch 109 is disposed between the node 802 and the node 111. The switch 110 is disposed between the node 802 and the node 112. The switch 115 is disposed between the terminal 117 and the node 111. The switch 116 is disposed between the terminal 117 and the node 112.

The switches 102 to 105, 109, 110, 115, and 116 complementarily operate; when the switches 102, 105, 109, and 116 are turned on (that is, electrically continuous), the switches 103, 104, 110, and 115 are turned off (that is, electrically non-continuous); conversely, when the switches 103, 104, 110, and 115 are turned on, the switches 102, 105, 109, and 116 are turned off.

These switches repeat on-off switching operation at a predetermined frequency f [Hz]. When the parasitic capacitance of each switch is assumed to be C [F], the switch can be regarded as a switched-capacitor resistor with a resistance R of f/C [Ω]. Therefore, the amplifier circuit 100A can be regarded as the equivalent circuit 100B in which switches 102 to 105, 109, 110, 115, and 116 are respectively replaced with equivalent resistors 121 to 128.

Now, an equilibrium point to which the whole of the equivalent circuit 100B illustrated in FIG. 2 converges will be considered when an element connected to the input terminal 101 is the capacitor 118. The gate of the transistor 113 with the second polarity and the gate of the transistor 114 with the second polarity are connected together. The drain of the transistor 113 and the drain of the transistor 114 are connected together through the equivalent resistor 125 and 126. A point at which the gate of the transistor 113 and the gate of the transistor 114 are connected together is connected to a point at which the equivalent resistors 125 and 126 are connected together. Therefore, the potential at the gate of the transistor 113 and the potential at the gate of the transistor 114 converge to Vdio determined by a current flowing in the current source 106, a potential at a diode connection in the transistor 113, and a potential at a diode connection in the transistor 114. The gate of the transistor 113 and the gate of the transistor 114 are connected to the terminal 111 through the equivalent resistor 125. The gate of the transistor 113 and the gate of the transistor 114 are also connected to the node 112 through the equivalent resistor 126. The gate of the transistor 113 and the gate of the transistor 114 are also connected to the terminal 117 through the equivalent resistors 125 and 127 or through the equivalent resistors 126 and 128. The gate of the transistor 113 and the gate of the transistor 114 are also connected to the input terminal 101 through the equivalent resistors 121 to 128. Therefore, the potentials at all of these terminals converge to Vdio.

That is, the potential at the input terminal 101 converges to Vdio regardless of the initial value. In this case, it becomes difficult for the amplifier circuit 100A to sample and hold an input potential and then to output a potential corresponding to the input potential.

The reason why the potential at the input terminal 101 converges to Vido is that the potential at the gate of the transistor 113 and the potential at the gate of the transistor 114 converge to Vdio. Therefore, the convergence potential is demanded to be an output potential Vout instead of Vdio. When the amplifier circuit 100A is used as a buffer circuit, the output potential Vout is an input potential Vin+.

Figure 3:
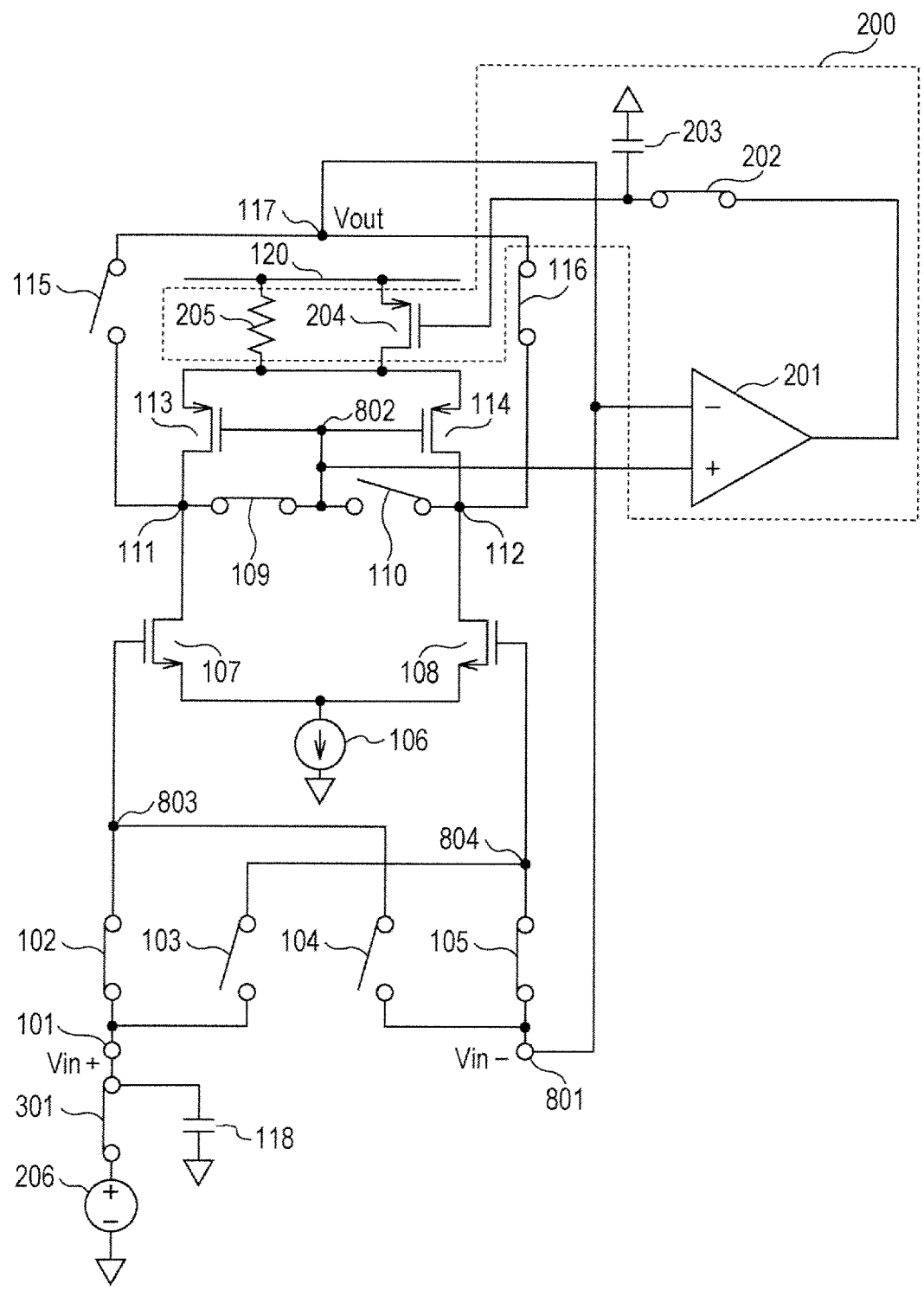
FIG. 3 illustrates the structure of another conventional amplifier circuit.

FIG. 3 illustrates the structure of another conventional amplifier circuit 100C.

As illustrated in FIG. 3, the amplifier circuit 100C has a negative feedback amplifier 200 composed of an operational amplifier 201, a switch 202, a capacitor 203, a transistor 204 with the second polarity, and a resistor 205, in addition to the structure of the amplifier circuit 100A. With amplifier circuit 100C, when the switch 202 is on, a feedback is applied by the negative feedback amplifier 200 so that the terminals 111 and 112 have the same potential. When the input terminal 101 is in connection with a voltage source 206 at that time, the whole of the amplifier circuit 100C converges to an equilibrium point determined by the voltage source 206. Therefore, Vdio becomes equal to Vout (by extension, Vin+). After that, when the switch 202 is turned off, the equilibrium state of the amplifier circuit 100C is held. Therefore, even after the potential at the voltage source 206 has been held by the capacitor 118, this equilibrium state can be maintained.

With the amplifier circuit 100C, however, it is difficult to sufficiently reduce noise. This is because the structure of the circuit composed of the transistors 113 and 114 and the switches 109 and 110 is no longer symmetric due to the addition of the negative feedback amplifier 200 to the amplifier circuit 100C. In a chopper modulation technology, it is known that when a circuit has no symmetry, noise modulation performance is lowered.

In view of this, the inventor made a study of an amplifier circuit having a symmetric circuit structure in which a chopper noise modulator that performs chopper modulation and an convergence part to the equilibrium point that converges an output potential to an equilibrium point are separately provided. In the description given below, a first amplifier circuit corresponds to the chopper noise modulator and a second amplifier circuit corresponds to the convergence part to the equilibrium point.

After repetition of the above study, the inventor has devised an amplifier circuit according to an aspect, described below, in the present disclosure.

An amplifier circuit according to an aspect of the present disclosure will be outlined below.

Item 1

An amplifier circuit has:
a first amplifier circuit including a chopper circuit, the first amplifier circuit being configured to amplify a first differential signal input between a first input terminal and a second input terminal to output a second differential signal; and
a second amplifier circuit configured to amplify the second differential signal to output a single-ended signal.

The second amplifier circuit includes:
a first circuit including a first transistor and a second transistor, the first circuit being connected to the first amplifier circuit so that the second differential signal is input into a gate of the first transistor and a gate of the second transistor, the first circuit being configured to convert the second differential signal to a current that flows into a first node connected to the first transistor and to a current that flows into a second node connected to the second transistor; and
a second circuit configured to negatively feed back a voltage at the second node so that a difference between a voltage at the first node and the voltage at the second node is reduced.

The second amplifier circuit is configured to output the single-ended signal from the first node.

Item 2

In the amplifier circuit described in item 1, the first amplifier circuit has:
a first chopper circuit including the first input terminal, the second input terminal, a first terminal, and a second terminal, the first chopper circuit being configured to make a switchover between an electrical connection in which the first input terminal is electrically connected to the first terminal and the second input terminal is electrically connected to the second terminal and an electrical connection in which the second input terminal is electrically connected to the first terminal and the first input terminal is electrically connected to the second terminal;

an amplifier configured to amplify a differential signal between the first terminal and the second terminal to a differential signal between a third terminal and a fourth terminal; and a second chopper circuit including the third terminal, the fourth terminal, a first output terminal connected to the gate of the first transistor, and a second output terminal connected to the gate of the second transistor, the second chopper circuit being configured to make a switchover between an electrical connection in which the third terminal is electrically connected to the first output terminal and the fourth terminal is electrically connected to the second output terminal and an electrical connection in which the fourth terminal is electrically connected to the first output terminal and the third terminal is electrically connected to the second output terminal.

Item 3

In the amplifier circuit described in item 1, the second circuit includes a current mirror electrically connected to the first node, the second node, and a third node, the current mirror being configured to copy a current flowing from the third node into the second node to cause a current to flow from the third node into the first node.

Item 4

In the amplifier circuit described in item 3, the second circuit includes a negative feedback amplifier electrically connected to the first node, the second node, and the third node, the negative feedback amplifier being configured to negatively feed back the voltage at the second node to the third node so that a potential difference between the first node and the second node is reduced.

Item 5

The amplifier circuit described in any one of items 1 to 4 has:

a buffer circuit electrically connected to the first node; and a feedback path that electrically connects an output terminal of the buffer circuit to the first input terminal or the second input terminal of the first amplifier circuit.

Item 6

The amplifier circuit described in item 5 has a resistive element, one end of the resistive element being electrically connected to the output terminal of the buffer circuit.

The feedback path electrically connects the other end of the resistive element to the first input terminal or the second input terminal of the first amplifier circuit.

Item 7

The amplifier circuit described in item 5 has a third transistor, one of a source and a drain of the third transistor being electrically connected to the output terminal of the buffer circuit.

The feedback path connects the other of the source and the drain of the third transistor to the first input terminal or the second input terminal of the first amplifier circuit.

An amplifier circuit according to another aspect of the present disclosure may have a first amplifier circuit and a second amplifier circuit. The first amplifier circuit has: a first switching circuit having a first input terminal, a second input terminal, a first terminal, and a second terminal, the first switching circuit making a switchover between an electrical connection in which the first input terminal is electrically connected to the first terminal and the second input terminal is electrically connected to the second terminal and an electrical connection in which the second input terminal is electrically connected to the first terminal and the first input terminal is electrically connected to the second terminal; and a second switching circuit having a third terminal, a fourth terminal, a first output terminal, and a second output terminal, the second switching circuit making a switchover between an electrical connection in which the third terminal is electrically connected to the first output terminal and the fourth terminal is electrically connected to the second output terminal and an electrical connection in which the fourth terminal is electrically connected to the first output terminal and the third terminal is electrically connected to the second output terminal. The second amplifier circuit has: a differential pair having a third output terminal, a fourth output terminal, a third input terminal electrically connected to the first output terminal, and a fourth input terminal electrically connected to the second output terminal; a current mirror, electrically connected to the third output terminal and the fourth output terminal and having a first voltage terminal, that copies a current flowing from the first voltage terminal into the fourth output terminal and causes the current to flow from the first voltage terminal into the third output terminal; and a negative feedback amplifier, electrically connected to the third output terminal, fourth output terminal and first voltage terminal, that sends a negative feedback to the first voltage terminal so that the potential difference between the third output terminal and the fourth output terminal is reduced. The second amplifier circuit amplifies a differential signal between the third input terminal and the fourth input terminal to a single-ended signal to be output from the third output terminal.

A specific example of the amplifier circuit according to an aspect of the present disclosure will be described with reference to the drawings. Embodiments described below are just specific examples of the present disclosure. Therefore, numerals, shapes, constituent elements, the placements and connection forms of these constituent elements, and the like indicated in the embodiments below are just examples, and are not intended to restrict the present disclosure. Of the constituent elements in the embodiments below, constituent elements not described in independent claims will be described as arbitrary constituent elements that can be added. Each drawing is schematic and is not necessarily drawn in a rigorous manner.

First Embodiment

Figure 4:
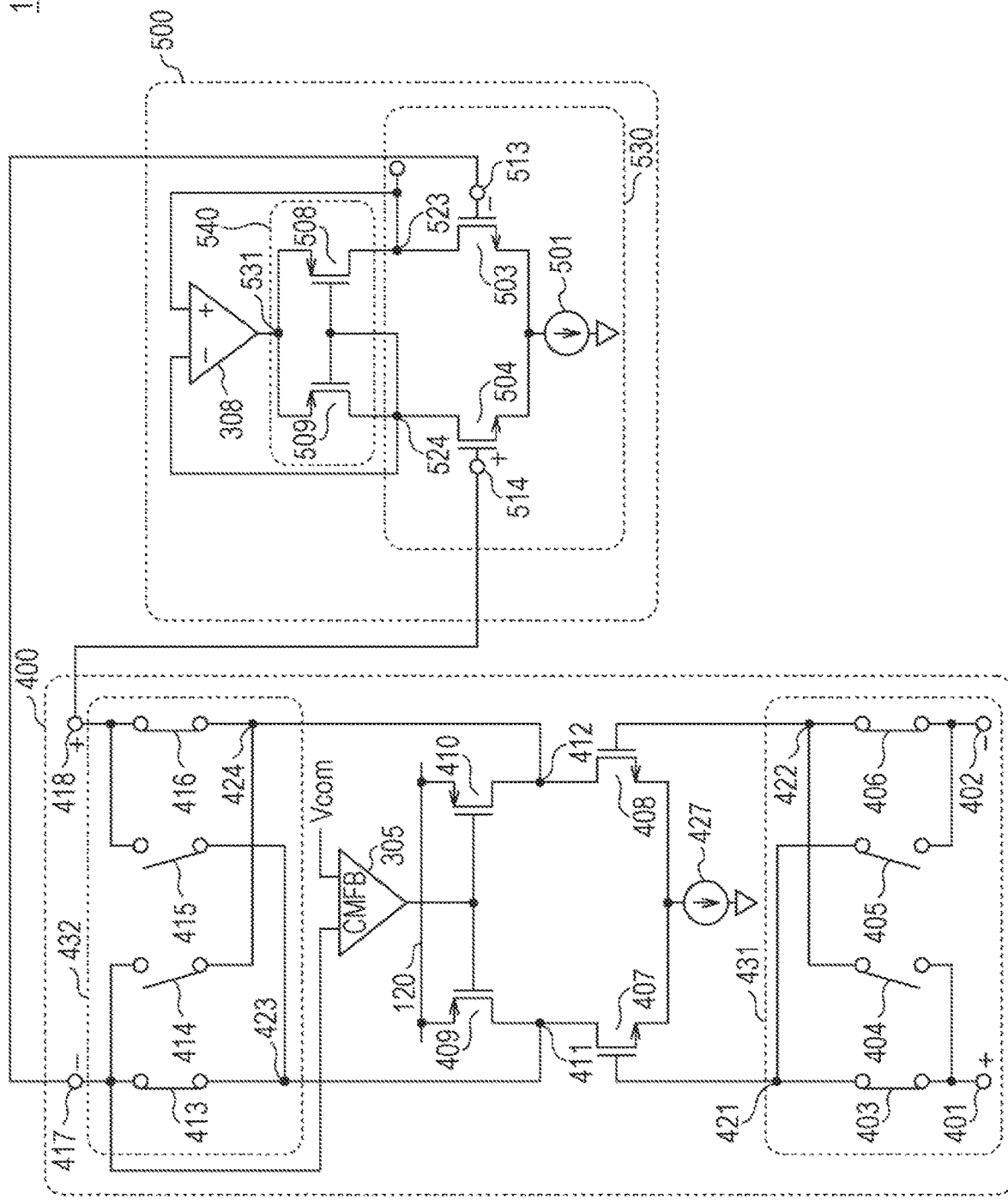
FIG. 4 illustrates the structure of an amplifier circuit according to a first embodiment.

FIG. 4 illustrates the structure of an amplifier circuit 10 according to a first embodiment of the present disclosure.

As illustrated in FIG. 4, the amplifier circuit 10 has a first amplifier circuit 400 and a second amplifier circuit 500.

The first amplifier circuit 400 has a first switching circuit 431, a second switching circuit 432, a common feedback amplifier 305, a current source 427, a transistor 407 having a first polarity (an N-channel polarity, for example), a transistor 408 having the first polarity, a transistor 409 having a second polarity (a P-channel polarity, for example), and a transistor 410 having the second polarity. Each of the first switching circuit 431 and second switching circuit 432 is also referred to as the chopper circuit. A circuit between the first switching circuit 431 and the second switching circuit 432 is also referred to as the amplifier.

The common feedback amplifier 305 may be a general operational amplifier. The amplifier including the common feedback amplifier 305 is not restricted to the structure illustrated in FIG. 4.

The first switching circuit 431 has a first input terminal 401, a second input terminal 402, a first terminal 421, a second terminal 422, and switches 403 to 406. The first switching circuit 431 makes a switchover between a first connection state in which the first input terminal 401 is electrically connected to the first terminal 421 and the second input terminal 402 is electrically connected to the second terminal 422 and a second connection state in which the second input terminal 402 is electrically connected to the first terminal 421 and the first input terminal 401 is electrically connected to the second terminal 422.

The second switching circuit 432 has a third terminal 423, a fourth terminal 424, a first output terminal 417, a second output terminal 418, and switches 413 to 416. The second switching circuit 432 makes a switchover between a third connection state in which the third terminal 423 is electrically connected to the first output terminal 417 and the fourth terminal 424 is electrically connected to the second output terminal 418 and a fourth connection state in which the fourth terminal 424 is electrically connected to the first output terminal 417 and the third terminal 423 is electrically connected to the second output terminal 418.

A first chopper signal is input into the switches 403, 406, 413, and 416. The first chopper signal alternately repeats a logical value of 1, which turns on the relevant switch, and a logical value of 0, which turns off the switch, at a predetermined frequency f. The switches 403, 406, 413, and 416 will sometimes be referred to as first-type switches.

A second chopper signal is input into the switches 404, 405, 414, and 415. The second chopper signal alternately takes a logical value of 1, which turns on the relevant switch, and a logical value of 0, which turns off the switch, at the predetermined frequency f. The switches 404, 405, 414, and 415 will sometimes be referred to as second-type switches.

Figure 5:
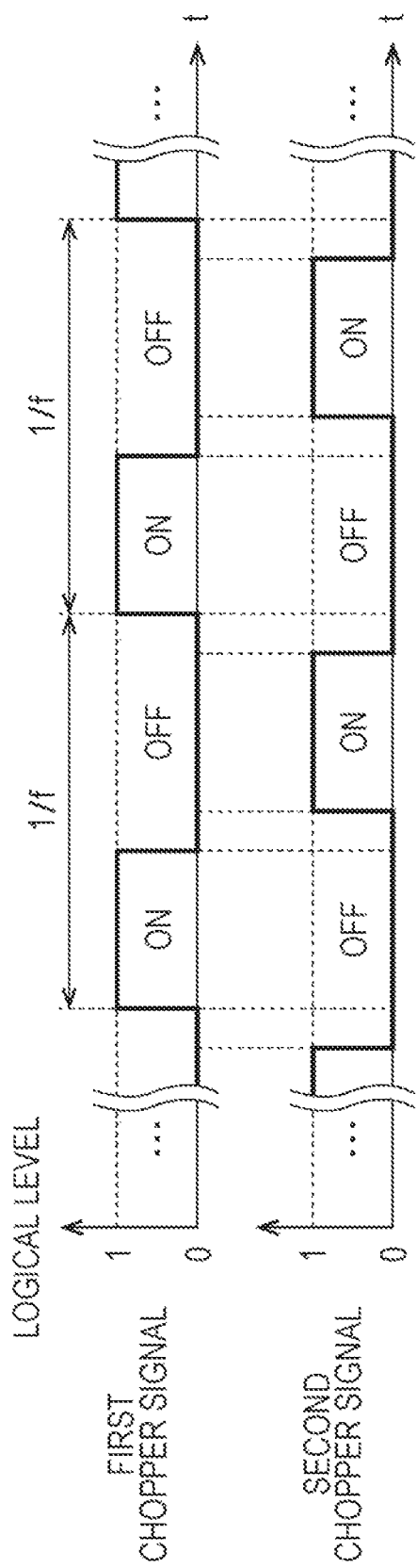
FIG. 5 is a timing diagram for a first chopper signal and a second chopper signal according to the first embodiment.

FIG. 5 is a timing diagram for the first chopper signal and second chopper signal.

As illustrated in FIG. 5, the first chopper signal and second chopper signal have a non-overlapping relationship in which they do not take the logical value 1 at the same time. Thus, the first-type switch and second-type switch are not turned on at the same time.

The first chopper signal and second chopper signal are supplied from, for example, a circuit outside the amplifier circuit 10.

The first amplifier circuit 400 is a fully-symmetrical amplifier circuit with differential input and differential output. The first amplifier circuit 400 amplifies a differential signal between the first terminal 421 and the second terminal 422 to a differential signal between the third terminal 423 and the fourth terminal 424. That is, the first amplifier circuit 400 amplifies a differential signal input between the first terminal 421 and the second terminal 422 and outputs the amplified signal as a differential signal between the third terminal 423 and the fourth terminal 424.

In the first amplifier circuit 400, a switchover of an inter-terminal connection by the first switching circuit 431 and a switchover of an inter-terminal connection by the second switching circuit 432 are performed at the predetermined frequency f. In the amplifier circuit 10, therefore, the first amplifier circuit 400 functions as a chopper noise modulator that performs chopper modulation.

The second amplifier circuit 500 has a differential pair 530, a current mirror 540, and a negative feedback amplifier 308.

The differential pair 530 has a third output terminal 523, a fourth output terminal 524, a third input terminal 513 electrically connected to the first output terminal 417 in the second switching circuit 432, a fourth input terminal 514 electrically connected to the second output terminal 418 in the second switching circuit 432, a current source 501, a transistor 503 having the first polarity, and a transistor 504 having the first polarity. The transistor 503 converts an input from the third input terminal 513 to a current that flows into the third output terminal 523, and the transistor 504 converts an input from the fourth input terminal 514 to a current that flows into the fourth output terminal 524. That is, the transistor 503 outputs a potential corresponding to an input from the third input terminal 513 to the third output terminal 523, and the transistor 504 outputs a potential corresponding to an input from the fourth input terminal 514 to the fourth output terminal 524. The third input terminal 513 exemplifies the first node. The fourth output terminal 524 exemplifies the second node.

The current mirror 540 has a transistor 508 having the second polarity, the drain of the transistor 508 being connected to the third output terminal 523, and a transistor 509 having the second polarity, the drain of the transistor 509 being connected to the fourth output terminal 524. The current mirror 540 also has a first-voltage terminal 531 to which the source of the transistor 508 and the source of the transistor 509 are connected. The current mirror 540 copies a current flowing from the first-voltage terminal 531 into the fourth output terminal 524 and causes the current to flow from the first-voltage terminal 531 into the third output terminal 523. The first-voltage terminal 531 exemplifies the third node.

The negative feedback amplifier 308 is electrically connected to the third output terminal 523, fourth output terminal 524, and first-voltage terminal 531. Specifically, the non-inverting input terminal of the negative feedback amplifier 308 is electrically connected to the third output terminal 523, and the inverting input terminal of the negative feedback amplifier 308 is electrically connected to the fourth output terminal 524. The output terminal of the negative feedback amplifier 308 is electrically connected to the first-voltage terminal 531. The negative feedback amplifier 308 sends a negative feedback to the first-voltage terminal 531 so that the potential difference between the third output terminal 523 and the fourth output terminal 524 is reduced. The negative feedback amplifier 308 may send a negative feedback to the first-voltage terminal 531 so that the potential difference between the third output terminal 523 and the fourth output terminal 524 is eliminated.

The second amplifier circuit 500 amplifies a differential signal between the third input terminal 513 and the fourth input terminal 514 to a single-ended signal to be output from the third output terminal 523. That is, the second amplifier circuit 500 amplifies a differential signal between the third input terminal 513 and the fourth input terminal 514 and outputs a single-ended signal from the third output terminal 523.

In the amplifier circuit 10, the second amplifier circuit 500 also functions as an convergence part to the equilibrium point that converges an output potential to an equilibrium point.

Figure 6:
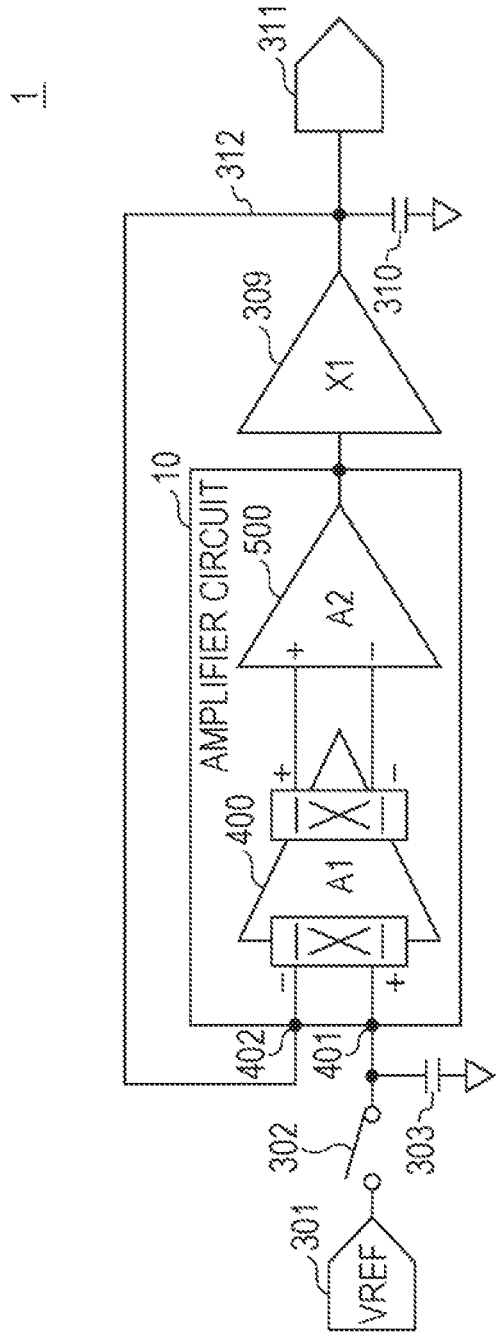
FIG. 6 illustrates the structure of a buffer circuit according to the first embodiment.

FIG. 6 illustrates the structure of a buffer circuit 1 implemented by using the amplifier circuit 10.

As illustrated in FIG. 6, the buffer circuit 1 has the amplifier circuit 10, a buffer circuit 309, an input terminal 301, an output terminal 311, a switch 302, capacitors 303 and 310, and a feedback path 312 through which a signal on the output side of the buffer circuit 309 is fed back to the input side of the first amplifier circuit 400. That is, the output terminal 311 of the buffer circuit 309 is connected to the second input terminal 402 in the first amplifier circuit 400 through the feedback path 312. The feedback path 312 is, for example, a wire.

The buffer circuit 1 samples and holds a potential VREF input from the input terminal 301 and outputs the potential VREF from the output terminal 311. The buffer circuit 309 may have a structure illustrated in FIG. 7, for example.

Figure 7:
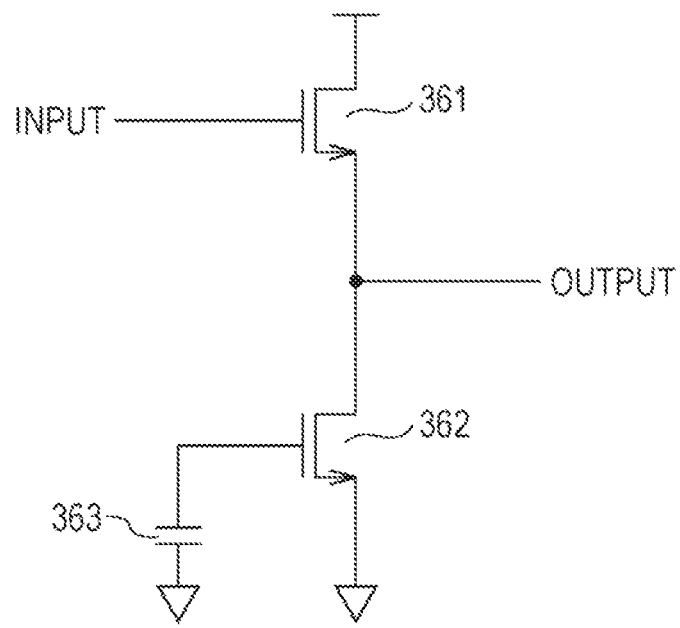
FIG. 7 illustrates the structure of a buffer circuit exemplified in the first embodiment.

In FIG. 7, the buffer circuit 309 has a single-ended input, single-ended output structure in which a transistor 361 having the first polarity, a transistor 362 having the first polarity, and a capacitor 363 are provided. The buffer circuit 309 is not restricted to a circuit structure illustrated in FIG. 7.

Although the circuit illustrated in FIG. 6 is referred to here as a buffer circuit, the circuit may be referred to as an amplifier circuit. That is, the circuit illustrated in FIG. 6 may be referred to as an amplifier circuit having the first amplifier circuit 400, second amplifier circuit 500, buffer circuit 309, and feedback path 312, In this case, the amplification ratio (that is, gain) of the amplifier circuit is by a factor of 1.

Figure 8:
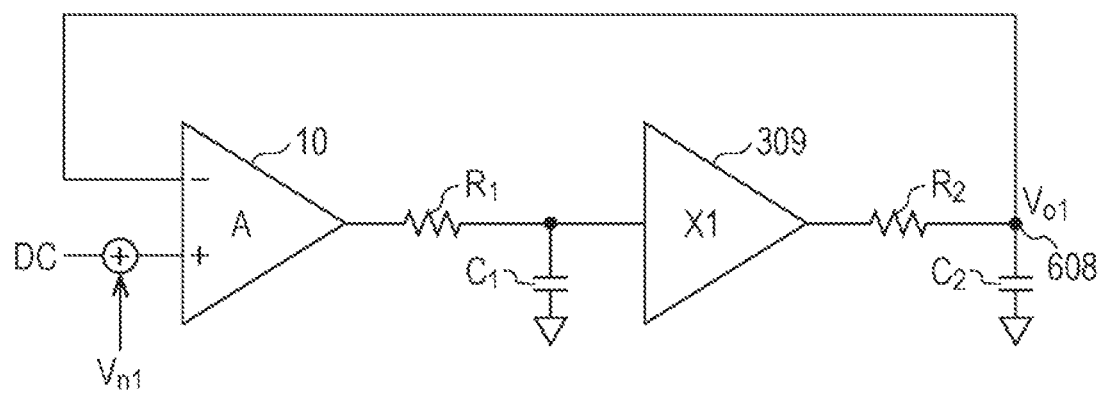
FIG. 8 schematically illustrates a first noise transmission function model for the buffer circuit according to the first embodiment.

FIG. 8 schematically illustrates a first noise transmission function model 600 for the buffer circuit 1.

In the first noise transmission function model 600, the amplification ratio of the amplifier circuit 10 is A, the output resistance of the amplifier circuit 10 is $R_1$, the load capacitance of the amplifier circuit 10 is $C_1$, the amplification ratio of the buffer circuit 309 is 1, the output resistance of the buffer circuit 309 is $R_2$, the load capacitance of the buffer circuit 309 is $C_2$, and input referred noise in the amplifier circuit 10 is $V_{n1}$, as illustrated in FIG. 8.

The load capacitance $C_1$ and load capacitance $C_2$ may be defined by using distributed constants of wires, may be defined by using lumped constants of capacitive elements connected to wires, or may be defined by using a combination of distributed constants and lumped constants.

In the first noise transmission function model 600, a noise transmission function to an output potential $V_{o1}$ at a terminal 608 with respect to input referred noise $V_{n1}$ is as follows.

$$V_{o1} = \frac{A}{(sC_1R_1+1)(sC_2R_2+1)+A}V_{n1}$$

Figure 9:
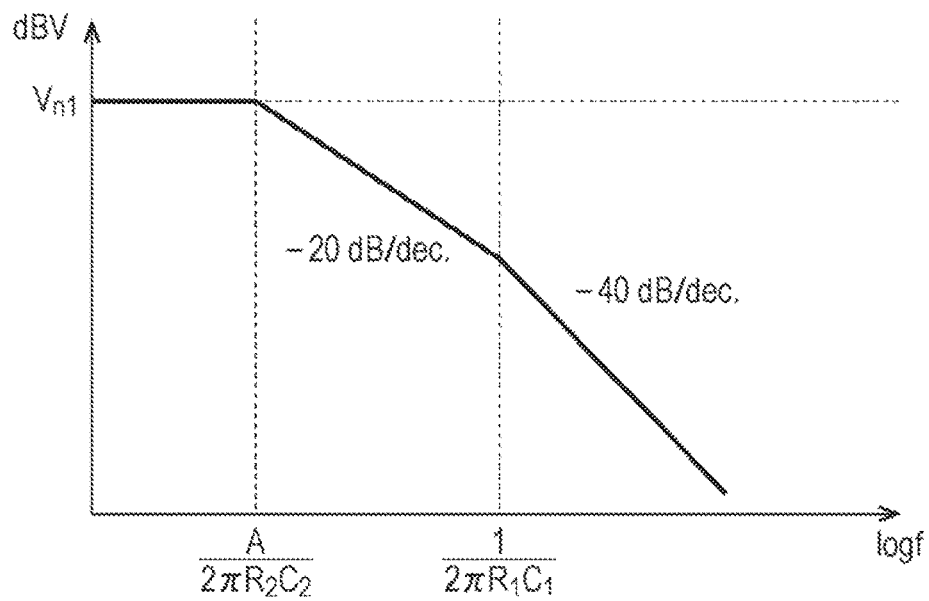
FIG. 9 is a frequency characteristic graph representing the frequency characteristics of $V_{o1}$ with respect to $V_{n1}$.

FIG. 9 is a frequency characteristic graph representing the frequency characteristics (also referred to below as the first frequency characteristics) of the potential $V_{o1}$ with respect to input referred noise $V_{n1}$ when $C_2R_2$ is much greater than $AC_1R_1$.

As illustrated in FIG. 9, the first frequency characteristics are like frequency characteristic of a low-pass filter for which $$\frac{A}{2\pi R_2 C_2}$$

is a first cut-off frequency and $$\frac{A}{2\pi R_1 C_1}$$

is a second cut-off frequency. In the first frequency characteristics, the attenuation rate is −20 db/dec in a frequency band from the first cut-off frequency to the second cut-off frequency and is −40 db/dec in a frequency band higher than the second cut-off frequency. This indicates that the buffer circuit 1 attenuates chopper noise generated due to chopper modulation.

Figure 10:
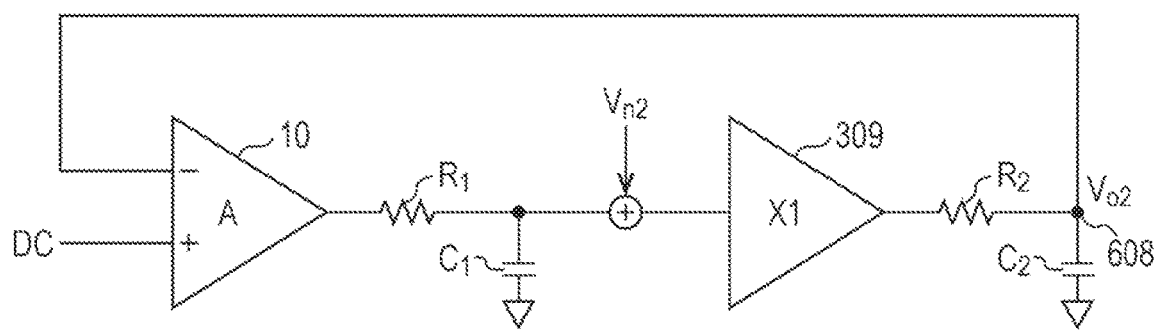
FIG. 10 schematically illustrates a second noise transmission function model for the buffer circuit according to the first embodiment.

FIG. 10 schematically illustrates a second noise transmission function model 700 for the buffer circuit 1.

In the second noise transmission function model 700, input referred noise $V_{n1}$ in the amplifier circuit 10 has been deleted from the first noise transmission function model 600, and input referred noise $V_{n2}$ in the buffer circuit 309 has been added instead.

In the second noise transmission function model 700, a noise transmission function to an output potential $V_{o1}$ at the terminal 608 with respect to input referred noise $V_{n2}$ is as follows.

$$V_{o2} = \frac{sC_1R_1+1}{(sC_1R_1+1)(sC_2R_2+1)+A}V_{n2}$$

Figure 11:
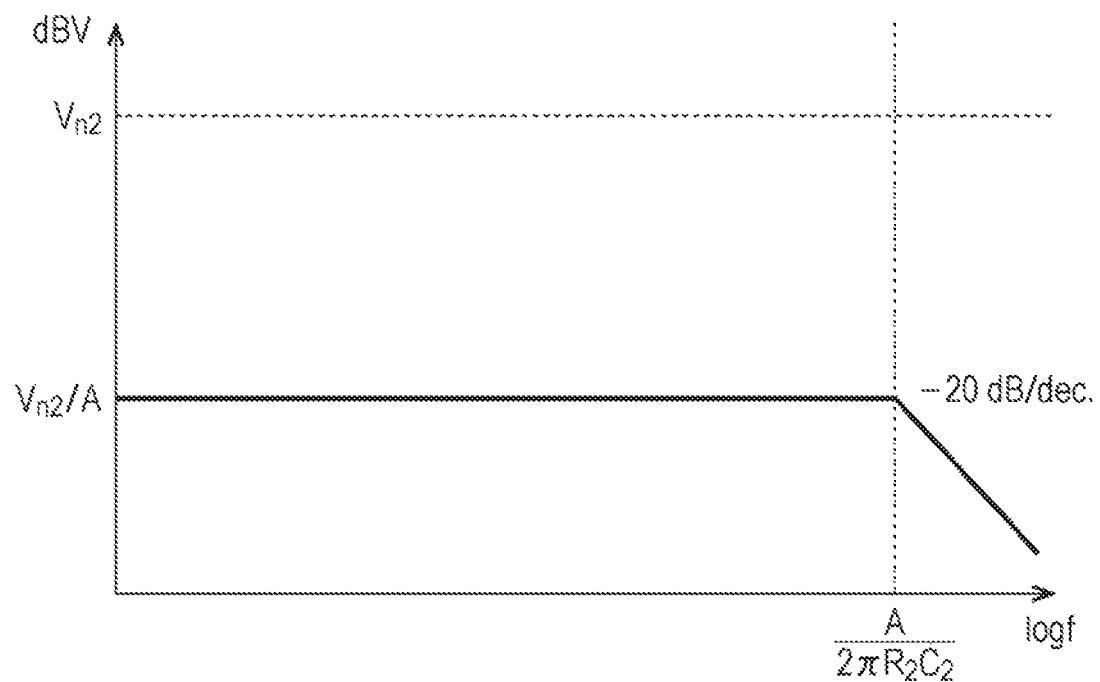
FIG. 11 is a frequency characteristic graph representing the frequency characteristics of $V_{o2}$ for $V_{n2}$.

FIG. 11 is a frequency characteristic graph representing the frequency characteristics (also referred to below as the second frequency characteristics) of the potential $V_{o1}$ with respect to input referred noise $V_{n2}$ when $C_2R_2$ is much greater than $AC_1R_1$.

As illustrated in FIG. 11, the second frequency characteristics are like frequency characteristic of a low-pass filter for which $$\frac{A}{2\pi R_2 C_2}$$

is a cut-off frequency as with the first frequency characteristics. This also indicates that the buffer circuit 1 attenuates chopper noise generated due to chopper modulation.

To simplify the above description, the condition that $C_2R_2$ is much greater than $AC_1R_1$ has been added. However, the buffer circuit 1 is not necessarily restricted to an example of a structure that satisfies this condition.

A noise simulation was performed for the buffer circuit 1. For comparison purposes, the noise simulation was also performed for a buffer circuit having the conventional structure. To form the buffer circuit having the conventional structure, the amplifier circuit 10 was removed from the buffer circuit 1. This type of buffer circuit will also be referred to as the conventional buffer circuit.

Figure 12:
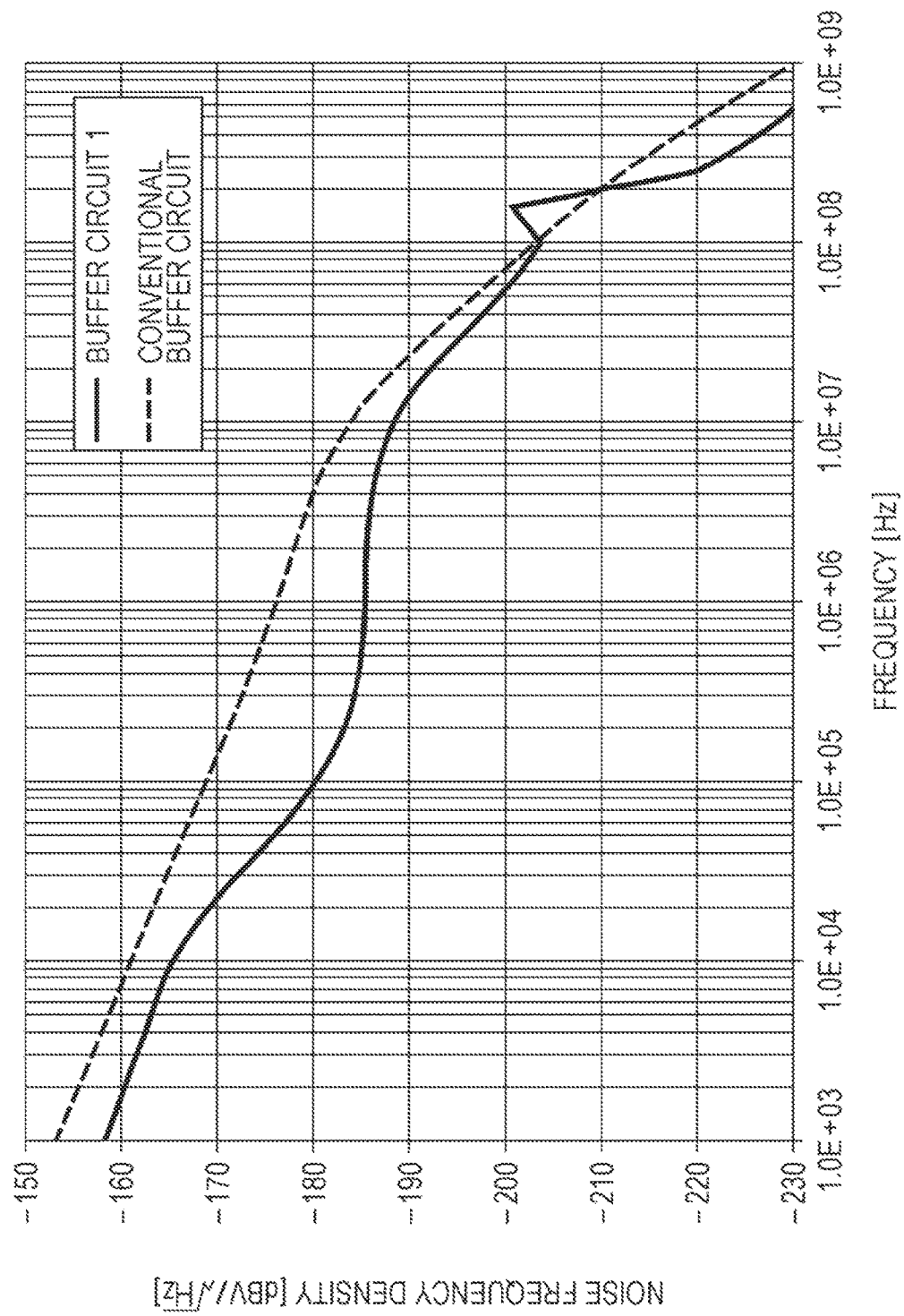
FIG. 12 is a noise spectrum diagram representing a noise spectrum in the buffer circuit according to the first embodiment and a noise spectrum in the conventional buffer circuit.

FIG. 12 illustrates a noise spectrum, obtained from this simulation, in the buffer circuit 1 and a noise spectrum, also obtained from this simulation, in the conventional buffer circuit.

As illustrated in FIG. 12, it was found from this simulation that the noise frequency density in the noise spectrum of the buffer circuit 1 was lower than the noise frequency density in the noise spectrum of the conventional buffer circuit in a frequency band at 1 kHz and higher. It was also found from this simulation that, in the buffer circuit 1, total integrated noise obtained by integrating the noise frequency density in the frequency area could be reduced by 48% when compared with the conventional buffer circuit. A peak present in a frequency band from 100 MHz to 200 MHz in the noise spectrum in the buffer circuit 1 was chopper noise mapped in a high-frequency area due to chopper modulation. Although this peak was higher than the noise level of the conventional buffer circuit, the peak was suppressed to a sufficiently low noise level due to the low-pass effect of a negative feedback loop when compared with total integrated noise.

As described above, the amplifier circuit 10 can implement a buffer circuit that can reduce noise.

Second Embodiment

A buffer circuit according to a second embodiment in which part of the structure of the buffer circuit 1 exemplified in the first embodiment is modified will be described as another example of a buffer circuit implemented by using the amplifier circuit 10.

Figure 13:
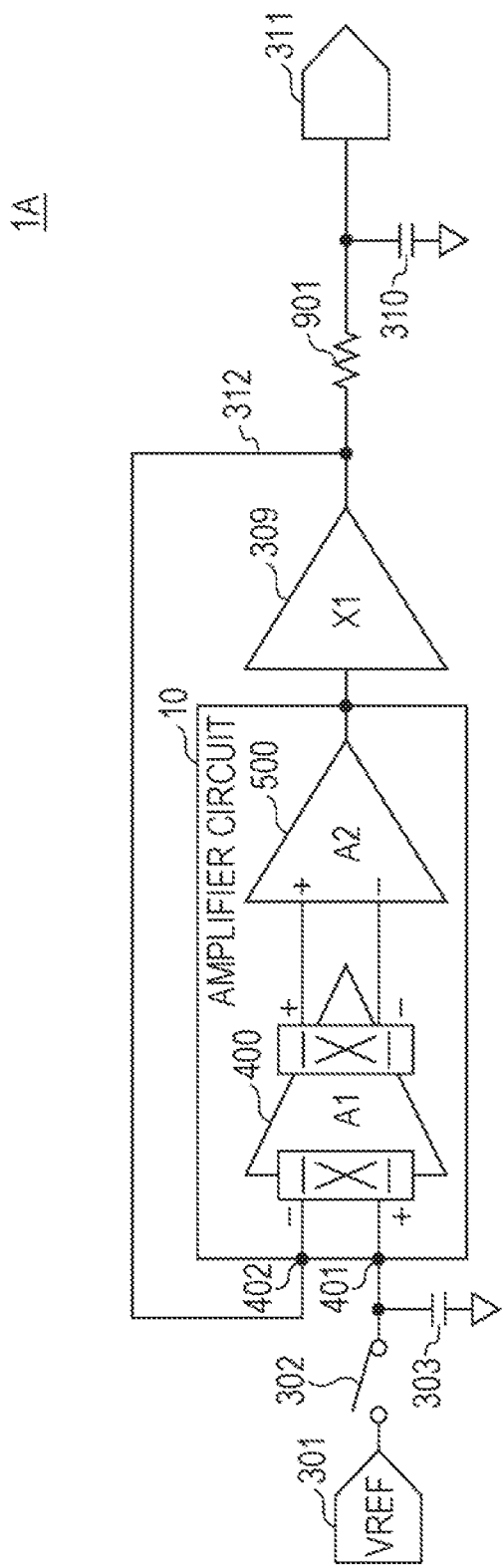
FIG. 13 illustrates the structure of a buffer circuit according to a second embodiment.

FIG. 13 illustrates the structure of a buffer circuit 1A implemented by using the amplifier circuit 10.

In the structure of the buffer circuit 1A, a resistive element 901 is added to the buffer circuit 1 according to the first embodiment between the buffer circuit 309 and the output terminal 311 so that the resistive element 901 is positioned closer to the output terminal 311 than is a branching point to the feedback path 312, as illustrated in FIG. 13.

With the buffer circuit 1A, the low-pass filter characteristics can be enhanced by the capacitor 310 and resistive element 901 when compared with the buffer circuit 1 according to the first embodiment. Therefore, the buffer circuit 1A can further reduce noise when compared with the buffer circuit 1.

Third Embodiment

A buffer circuit according to a third embodiment in which part of the structure of the buffer circuit 1A exemplified in the second embodiment is modified will be described as another example of a buffer circuit implemented by using the amplifier circuit 10.

Figure 14:
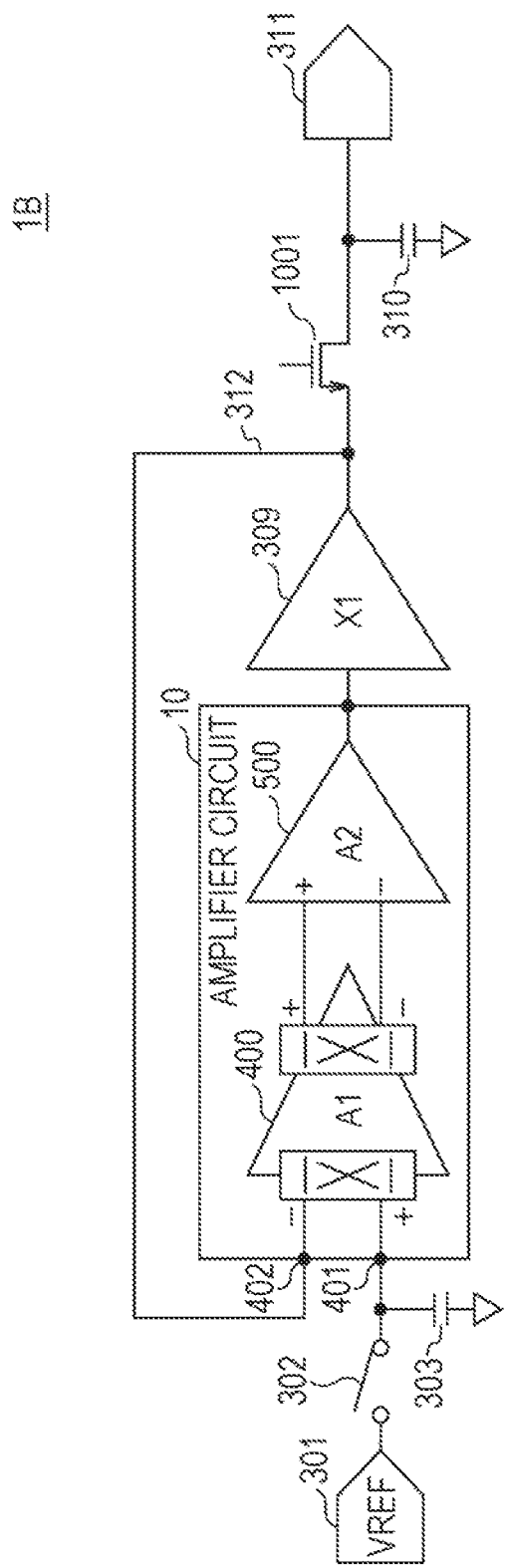
FIG. 14 illustrates the structure of a buffer circuit according to a third embodiment.

FIG. 14 illustrates the structure of a buffer circuit 1B implemented by using the amplifier circuit 10.

In the structure of the buffer circuit 1B, the buffer circuit 1A according to the second embodiment is modified in such a way that the resistive element 901 is replaced with a transistor 1001 having the first polarity, as illustrated in FIG. 14. As with the buffer circuit 1A, the buffer circuit 1B can reduce more noise than the buffer circuit 1. The buffer circuit 1B can also adjust the resistance of the transistor 1001 by adjusting the gate potential at the transistor 1001. Therefore, the buffer circuit 1B can adjust the extent by which the low-pass filter characteristics are enhanced.

Fourth Embodiment

A buffer circuit according to a fourth embodiment in which part of the structure of the buffer circuit 1A exemplified in the second embodiment is modified will be described as another example of a buffer circuit implemented by using the amplifier circuit 10.

Figure 15:
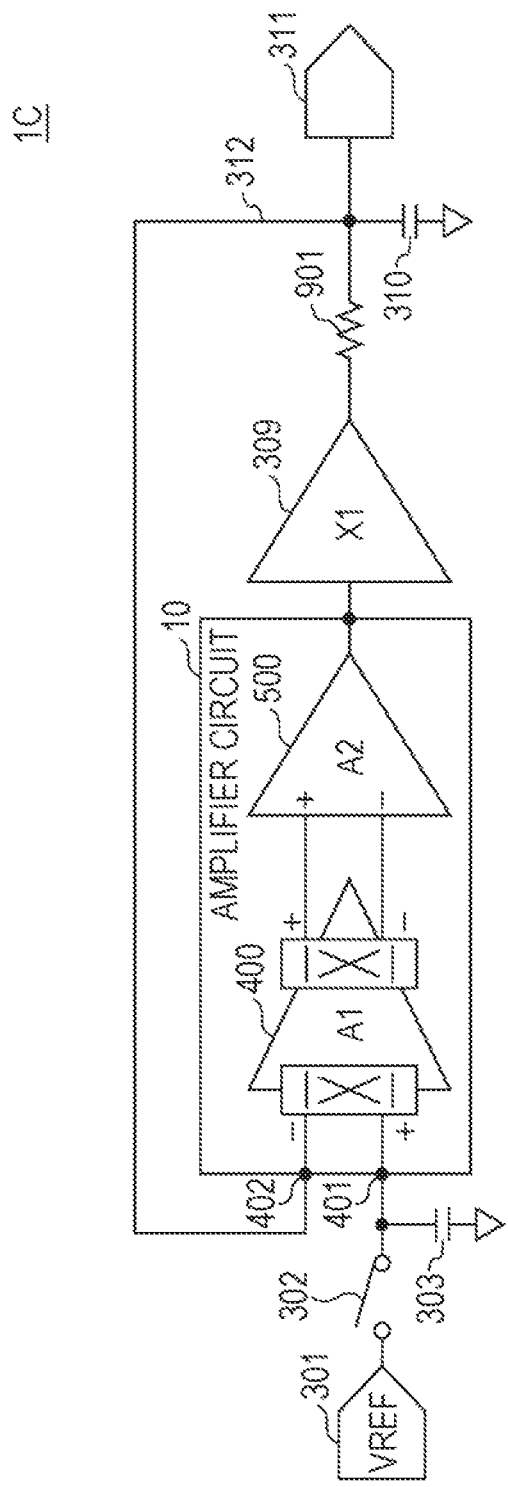
FIG. 15 illustrates the structure of a buffer circuit according to a fourth embodiment.

FIG. 15 illustrates the structure of a buffer circuit 1C implemented by using the amplifier circuit 10.

In the structure of the buffer circuit 1C, the buffer circuit 1A according to the second embodiment is modified in such a way that the resistive element 901 is positioned between the buffer circuit 309 and the feedback path 312, as illustrated in FIG. 15. That is, one end of the resistive element 901 is connected to the output terminal of the buffer circuit 309 and the other end of the resistive element 901 is connected to the second input terminal 402 in the first amplifier circuit 400 through the feedback path 312.

As with the buffer circuit 1A, the buffer circuit 1C can reduce more noise than the buffer circuit 1. In the buffer circuit 1C, the resistive element 901 is included in the negative feedback loop formed by the feedback path 312. Specifically, in the buffer circuit 1C, the resistive element 901 is not present between the output terminal 311 and the feedback path 312, unlike the buffer circuit 1A. Therefore, the buffer circuit 1C can feed back a voltage change at the output terminal 311 to the input side of the first amplifier circuit 400 without passing through the resistive element 901. This enables the buffer circuit 1C to further enhance the responsiveness of the negative feedback loop to the output terminal 311 when compared with the buffer circuit 1A according to the second embodiment.

Fifth Embodiment

A buffer circuit according to a fifth embodiment in which part of the structure of the buffer circuit 1B exemplified in the third embodiment is modified will be described as another example of a buffer circuit implemented by using the amplifier circuit 10.

Figure 16:
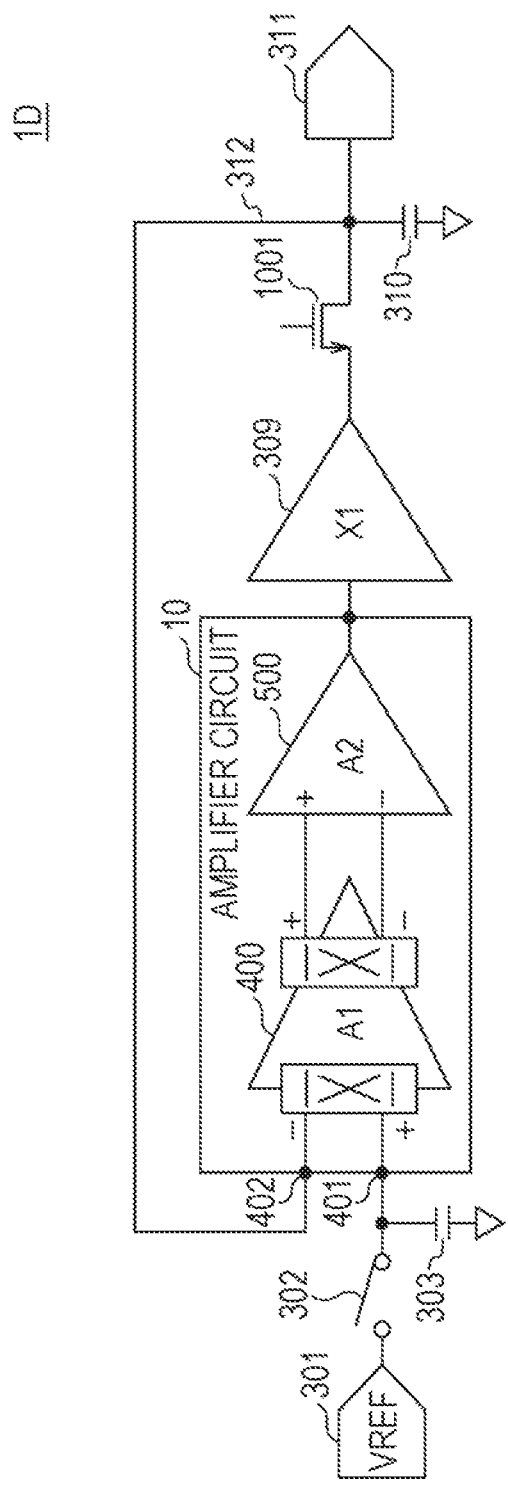
FIG. 16 illustrates the structure of a buffer circuit according to a fifth embodiment.

FIG. 16 illustrates the structure of a buffer circuit 1D implemented by using the amplifier circuit 10.

In the structure of the buffer circuit 1D, the buffer circuit 1B according to the third embodiment is modified in such a way that the transistor 1001 having the first polarity is positioned between the buffer circuit 309 and the feedback path 312, as illustrated in FIG. 16. That is, one of the source and drain of the transistor 1001 is connected to the output terminal of the buffer circuit 309 and the other of the source and drain is connected to the second input terminal 402 in the first amplifier circuit 400 through the feedback path 312.

As with the buffer circuit 1B, the buffer circuit 1D can reduce more noise than the buffer circuit 1. The buffer circuit 1D can also adjust the resistance of the transistor 1001 by adjusting the gate potential at the transistor 1001. Therefore, the buffer circuit 1D can adjust the extent by which the low-pass filter characteristics are enhanced. In the buffer circuit 1D, the transistor 1001 is included in the negative feedback loop formed by the feedback path 312. Specifically, in the buffer circuit 1D, the transistor 1001 is not present between the output terminal 311 and the feedback path 312, unlike the buffer circuit 1B. Therefore, the buffer circuit 1D can feed back a voltage change at the output terminal 311 to the input side of the first amplifier circuit 400 without passing through the transistor 1001. This enables the buffer circuit 1D to further enhance responsiveness to the output terminal 311 when compared with the buffer circuit 1 according to the first embodiment.

Sixth Embodiment

The amplifier circuit 10 described so far can be applied to a voltage supply circuit that supplies a reference voltage in an analog-to-digital (AD) converter or the like.

Figure 17:
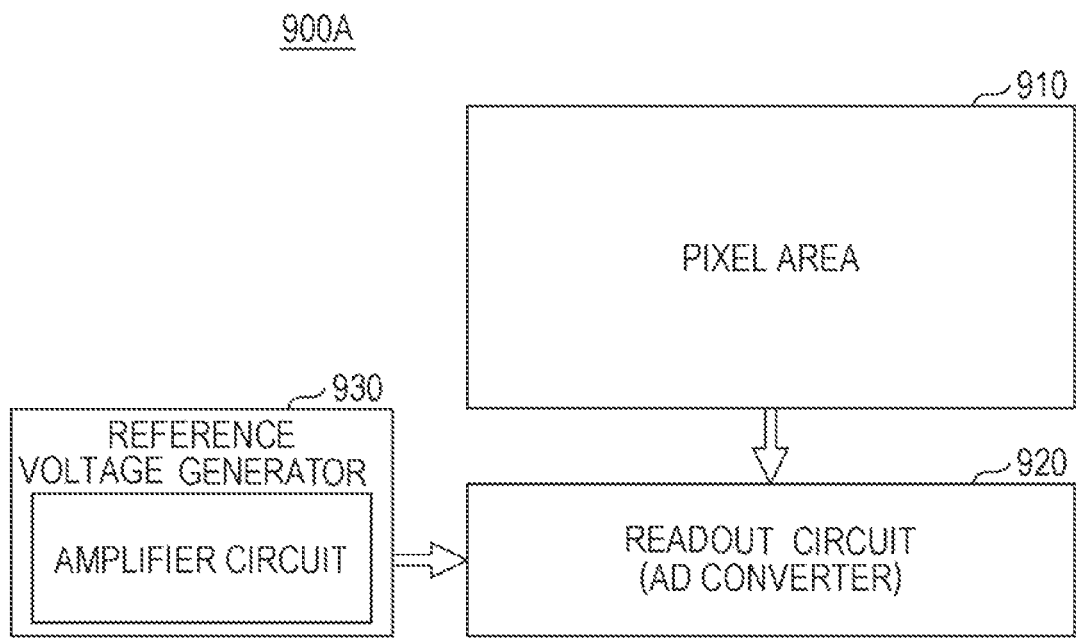
FIG. 17 illustrates the structure of an imaging apparatus according to a sixth embodiment.

FIG. 17 schematically illustrates the structure of an imaging apparatus 900A according to a sixth embodiment. The imaging apparatus 900A includes a pixel area 910, an AD converter 920, and a reference voltage generator 930. The pixel area 910 includes a plurality of pixels, each of which has a photoelectric converter. The AD converter 920 converts an analog signal output from each pixel in the pixel area 910 to a digital signal. The reference voltage generator 930 supplies a reference voltage used in AD conversion to the AD converter 920. The amplifier circuit 10 in the first to fifth embodiments can be used in the reference voltage generator 930 as an amplifier circuit that creates a reference voltage. When the amplifier circuit 10 in the present disclosure is used, a reference voltage with noise lower than before can be created. Therefore, it is possible to implement a low-noise imaging apparatus with high picture quality.

Figure 18:
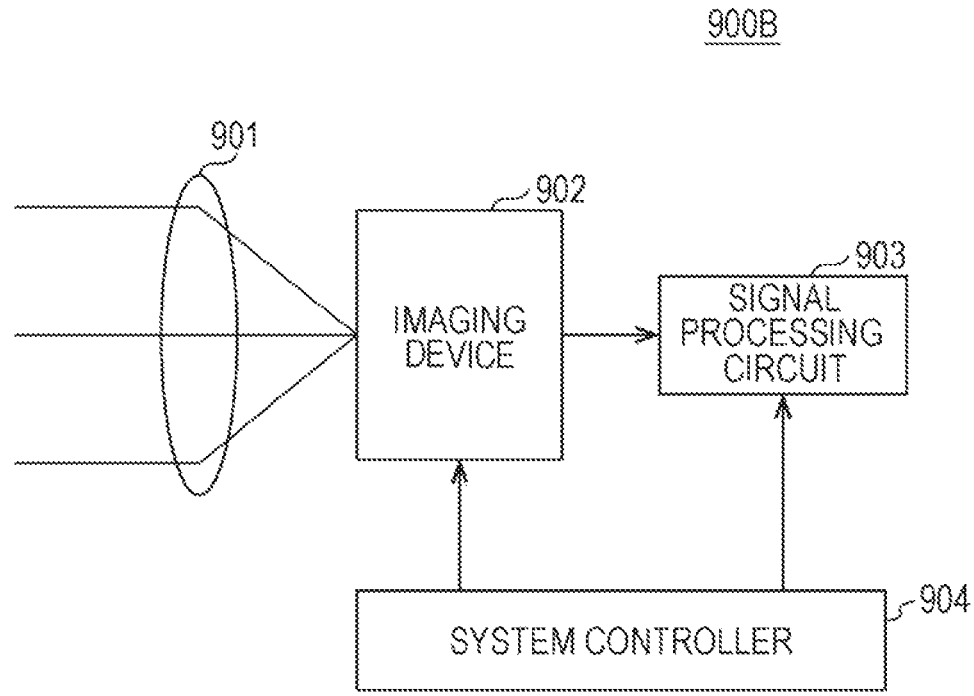
FIG. 18 illustrates the structure of a camera system according to the sixth embodiment.

FIG. 18 schematically illustrates the structure of a camera system 900B in which an imaging apparatus is used. The camera system 900B has a lens optics 901, an imaging apparatus 902, a system controller 904, and a camera signal processor 903. The lens optics 901 includes an auto-focus lens, a zoom lens, and a diaphragm, for example. The lens optics 901 focuses light onto the imaging surface of the imaging apparatus 902. The system controller 904 controls the whole of the camera system 900B. The system controller 904 can be implemented by, for example, a microcomputer. The camera signal processor 903 functions as a signal processing circuit that processes output signals sent from the imaging apparatus 902. The camera signal processor 903 performs processing such as, for example, gamma correction, color interpolation processing, spatial interpolation, and auto white balance processing. The camera signal processor 903 can be implemented by, for example, a digital signal processor (DSP) or the like.

With the camera system 900B according to the sixth embodiment, superior image with low noise can be acquired.

Complement

So far, the first to fifth embodiments have been described as an example of the technology disclosed in this application. However, the technology in the present disclosure is not limited to these embodiments, but can also be applied to embodiments in which changes, replacements, additions, omissions, and the like are appropriately performed, without departing from the intended scope of the present disclosure.

Examples of variations of the present disclosure will be described below.

1. In this description, the first polarity and second polarity have been respectively described as being, for example, the N-channel polarity and P-channel polarity. However, the technology is not necessarily limited to a case in which the first polarity is the N-channel polarity and the second polarity is the P-channel polarity. For example, the first polarity may be the P-channel polarity and the second polarity may be the N-channel polarity.

2. In the first to fifth embodiments, the buffer circuits 1 and 1A to 1D have been described as being structured so as to include the buffer circuit 309.

However, if the buffer circuits 1 and 1A to 1D do not need to have so high an output driving capacity and the potential VREF input from the input terminal 301 is thereby within the output voltage range of the second amplifier circuit 500, the buffer circuit 309 may be omitted.

INDUSTRIAL APPLICABILITY

The amplifier circuit in the present disclosure can be widely used in apparatuses that need to amplify electric signals.

What is claimed is:

1. An amplifier circuit comprising:
a first amplifier circuit including a chopper circuit, the first amplifier circuit being configured to amplify a first differential signal input between a first input terminal and a second input terminal to output a second differential signal; and
a second amplifier circuit configured to amplify the second differential signal to output a single-ended signal, wherein:
the second amplifier circuit includes
a first circuit including a first transistor and a second transistor, the first circuit being connected to the first amplifier circuit so that the second differential signal is input into a gate of the first transistor and a gate of the second transistor, the first circuit being configured to convert the second differential signal to a current that flows into a first node connected to the first transistor and to a current that flows into a second node connected to the second transistor, and
a second circuit including a negative feedback amplifier electrically connected to the first node and the second node, the negative feedback amplifier being configured to negatively feed back a voltage at the second node so that a difference between a voltage at the first node and the voltage at the second node is reduced, and
the second amplifier circuit is configured to output the single-ended signal from the first node.

2. The amplifier circuit according to claim 1, wherein the first amplifier circuit includes:
a first chopper circuit including the first input terminal, the second input terminal, a first terminal, and a second terminal, the first chopper circuit being configured to make a switchover between an electrical connection in which the first input terminal is electrically connected to the first terminal and the second input terminal is electrically connected to the second terminal and an electrical connection in which the second input terminal is electrically connected to the first terminal and the first input terminal is electrically connected to the second terminal;
an amplifier configured to amplify a differential signal between the first terminal and the second terminal to a differential signal between a third terminal and a fourth terminal; and
a second chopper circuit including the third terminal, the fourth terminal, a first output terminal connected to the gate of the first transistor, and a second output terminal connected to the gate of the second transistor, the second chopper circuit being configured to make a switchover between an electrical connection in which the third terminal is electrically connected to the first output terminal and the fourth terminal is electrically connected to the second output terminal and an electrical connection in which the fourth terminal is electrically connected to the first output terminal and the third terminal is electrically connected to the second output terminal.

3. The amplifier circuit according to claim 1, wherein the second circuit includes a current mirror electrically connected to the first node, the second node, and a third node, the current mirror being configured to copy a current flowing from the third node into the second node to cause a current to flow from the third node into the first node.

4. The amplifier circuit according to claim 3, wherein the negative feedback amplifier is electrically connected to the third node, the negative feedback amplifier being configured to negatively feed back the voltage at the second node to the third node so that a potential difference between the first node and the second node is reduced.

5. The amplifier circuit according to claim 1, further comprising:
a buffer circuit electrically connected to the first node; and
a feedback path that electrically connects an output terminal of the buffer circuit to the first input terminal or the second input terminal of the first amplifier circuit.

6. The amplifier circuit according to claim 5, further comprising a resistive element, one end of the resistive element being electrically connected to the output terminal of the buffer circuit, wherein
the feedback path electrically connects the other end of the resistive element to the first input terminal or the second input terminal of the first amplifier circuit.

7. The amplifier circuit according to claim 5, further comprising a third transistor, one of a source and a drain of the third transistor being electrically connected to the output terminal of the buffer circuit, wherein
the feedback path connects the other of the source and the drain of the third transistor to the first input terminal or the second input terminal of the first amplifier circuit.

8. An amplifier circuit comprising:
a first amplifier circuit including a chopper circuit, the first amplifier circuit being configured to amplify a first differential signal input between a first input terminal and a second input terminal to output a second differential signal; and
a second amplifier circuit configured to amplify the second differential signal to output a single-ended signal, wherein:
the second amplifier circuit includes
a first circuit including a first transistor and a second transistor, the first circuit being connected to the first amplifier circuit so that the second differential signal is input into a gate of the first transistor and a gate of the second transistor, the first circuit being configured to convert the second differential signal to a current that flows into a first node connected to the first transistor and to a current that flows into a second node connected to the second transistor, and
a second circuit configured to negatively feed back a voltage at the second node so that a difference between a voltage at the first node and the voltage at the second node is reduced,
the second amplifier circuit is configured to output the single-ended signal from the first node, and
the amplifier circuit further comprises:
a buffer circuit electrically connected to the first node; and
a feedback path that electrically connects an output terminal of the buffer circuit to the first input terminal or the second input terminal of the first amplifier circuit.

9. The amplifier circuit according to claim 8, further comprising a resistive element, one end of the resistive element being electrically connected to the output terminal of the buffer circuit, wherein
the feedback path electrically connects the other end of the resistive element to the first input terminal or the second input terminal of the first amplifier circuit.

10. The amplifier circuit according to claim 8, further comprising a third transistor, one of a source and a drain of the third transistor being electrically connected to the output terminal of the buffer circuit, wherein
the feedback path connects the other of the source and the drain of the third transistor to the first input terminal or the second input terminal of the first amplifier circuit.

* * * * *